(12) United States Patent
Asao

(10) Patent No.: US 8,383,934 B2
(45) Date of Patent: Feb. 26, 2013

(54) ELECTRICAL JUNCTION BOX

(75) Inventor: Takahiro Asao, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 341 days.

(21) Appl. No.: 12/888,904

(22) Filed: Sep. 23, 2010

(65) Prior Publication Data

US 2011/0094794 A1   Apr. 28, 2011

(30) Foreign Application Priority Data

Oct. 28, 2009 (JP) .................. 2009-248269

(51) Int. Cl.
*H05K 5/00* (2006.01)

(52) U.S. Cl. .................. 174/50; 439/76.2; 174/549

(58) Field of Classification Search ................ 439/76.2; 174/50, 541, 549
See application file for complete search history.

(56) References Cited

U.S. PATENT DOCUMENTS

| | | | | |
|---|---|---|---|---|
| 3,435,125 A * | 3/1969 | Keogh et al. .................... | 174/59 |
| 3,841,032 A * | 10/1974 | Grannis, III .................... | 336/65 |
| 5,533,905 A * | 7/1996 | Hio et al. .................... | 439/76.2 |
| 6,034,327 A | 3/2000 | Furuya | |
| 6,069,315 A * | 5/2000 | Tang .................... | 174/50 |
| 6,178,106 B1 | 1/2001 | Umemoto et al. | |
| 6,322,376 B1 * | 11/2001 | Jetton .................... | 439/76.2 |
| 7,121,847 B1 * | 10/2006 | Jetton et al. .................... | 439/76.2 |
| 7,568,921 B2 * | 8/2009 | Pavlovic et al. .................... | 439/76.2 |
| 7,785,116 B2 * | 8/2010 | Akahori et al. .................... | 439/76.2 |
| 7,914,300 B2 * | 3/2011 | Akahori et al. .................... | 439/76.2 |
| 7,931,479 B1 * | 4/2011 | De La Reza et al. .................... | 439/76.2 |
| 2006/0258186 A1 * | 11/2006 | Egawa et al. .................... | 439/76.2 |
| 2009/0269951 A1 * | 10/2009 | Scheele et al. .................... | 439/76.2 |
| 2011/0094793 A1 * | 4/2011 | Asao .................... | 174/549 |

FOREIGN PATENT DOCUMENTS

JP    A-11-007990    1/1999

* cited by examiner

*Primary Examiner* — Hung Ngo

(74) *Attorney, Agent, or Firm* — Oliff & Berridge, PLC

(57) ABSTRACT

An electrical junction box having a in which a plurality of connecting bolts are juxtaposed on a bolt support section and that exerts excellent strength to realize a reinforcing structure without interfering with mounting of a connecting plate onto the connecting bolts. Inserting slits are provided in a peripheral wall and a proximal end of a partition wall. A connecting plate is previously disposed through the slits on one surface of a bolt support section. A plurality of connecting bolts are attached to the bolt support section so that the bolt support section bridges the plural connecting bolts.

8 Claims, 3 Drawing Sheets

ELECTRICAL JUNCTION BOX

BACKGROUND

This application claims priority to Japanese Patent Application No. JP2009-248269, filed in Japan on Oct. 28, 2009, the entire disclosure of which is hereby incorporated by reference.

The exemplary embodiments of the present invention relate to an electrical junction box to be mounted on a motor vehicle, and more particularly relates to an electrical junction box provided with connecting bolts to which external terminals are coupled.

Heretofore, a structure equipped with connecting bolts has been known in an electrical junction box. Connecting terminals (external terminals) of external circuits are coupled to the connecting bolts in order to connect the external circuits to internal circuits. For example, JP HEI 11(1999)-7990 A has disclosed an electrical junction box in which connecting bolts are electrically coupled to internal circuits, external terminals are attached to the connecting bolts and the terminals and bolts are fastened to one another by nuts to connect the external circuits to the internal circuits.

Since the respective connecting bolts are subject to fastening forces upon securing of the external terminals, a bolt support section in the electrical junction box requires great strength. As disclosed in JP HEI 11(1999)-7990, the bolt support section is provided with a peripheral wall that surrounds the connecting bolts, thereby preventing a short circuit and enhancing strength.

However, in the case where a plurality of connecting bolts are juxtaposed on the bolt support section, there is a problem that the peripheral wall cannot exert a sufficient reinforcement effect. That is, in many cases, a plurality of connecting bolts are provided in the electrical junction box in order to connect the internal circuits to the external circuits, and the connecting bolts and connecting plates are electrically interconnected to each other to define branched circuits. In this case, a sufficient reinforcement effect cannot be obtained by the peripheral wall that surrounds a whole outer periphery of the bolt support section on which a plurality of connecting bolts are provided.

It may be intended that a partition wall for partitioning adjacent connecting bolts is integrally provided on the bolt support section in addition to the peripheral wall that surrounds the whole outer periphery of the bolt support section. However, such partition wall will make it difficult to bridge the adjacent connecting bolts by the connecting plate.

SUMMARY

In view of the above problems, an object of the present invention is to provide an electrical junction box having a new structure in which a plurality of connecting bolts are juxtaposed on a bolt support section and that exerts excellent strength to realize a reinforcing structure without interfering with mounting of a connecting plate onto the connecting bolts.

A first exemplary embodiment is directed to an electrical junction box. In the electrical junction box in the first aspect, a plurality of connecting bolts are attached to a bolt support section, and the connecting bolts are fastened to and secured to external terminals by nuts. A plurality of bolt receiving apertures are provided side by side in the bolt support section. The bolt support section is provided integrally on the one surface with a peripheral wall that surrounds the bolt receiving apertures and with a partition wall provided inside the peripheral wall for partitioning the adjacent bolt receiving apertures. Inserting slits are provided in the peripheral wall and a proximal end of the partition wall. A connecting plate is provided with bolt inserting apertures at positions corresponding to the bolt receiving apertures. The connecting plate is inserted into the inserting slits so that the connecting plate is disposed on the one surface of the bolt support section. The connecting bolts pass through the bolt receiving apertures and bolt inserting apertures from the other surface of the bolt support section to be attached to the bolt support section.

According to the electrical junction box in the first exemplary embodiment, it is possible to reinforce the periphery around the bolt receiving apertures in the bolt support section by the peripheral wall that surrounds the whole outer peripheral wall of the bolt support section and the partition wall that partitions the adjacent connecting bolts. In addition, it is possible to dispose the connecting plate on the one surface of the bolt support section while maintaining the peripheral wall and partition wall by providing the slits in the peripheral wall and the proximal end of the partition wall. Thus, since the connecting plate is directly contacted with the external terminals and the plate and terminals are fastened to each other by the nuts, it is possible to enhance an electrical current conductive efficiency while obtaining sufficient strength for the bolt support section.

Since the connecting plate is inserted into the inserting slits in the peripheral wall and proximal end of the partition wall to be attached to the electrical junction box, it is possible to prevent the connecting plate from being disengaged from the bolt support section after the connecting plate is disposed on the bolt support section. Accordingly, it is possible to maintain a stable arrangement of the connecting plate on the bolt support section even upon transportation of the electrical junction box.

According to a second exemplary embodiment, the connecting bolts are inserted into the bolt inserting apertures from the other surface of the bolt support section. The connecting bolts are restrained from turning about central axes and are prevented from being disengaged from the bolt inserting apertures. Bolt holding means maintains an attaching condition of the connecting bolts to the bolt support section.

According to the electrical junction box of the second exemplary embodiment, it is possible to maintain a stable attaching condition of the connecting bolts on the bolt support section. Consequently, it is possible to stabilize a mounting condition of the connecting plate to the plural connecting bolts.

In a third exemplary embodiment, a bus bar that constitutes internal circuits is incorporated in the box. The bus bar is integrally provided with bus bar terminal portions having bolt inserting apertures. The bus bar terminal portions are inserted into the bolt receiving apertures from the other surface of the bolt support section to be superimposed on the connecting plate. The connecting bolts are inserted into and fastened to the bolt inserting apertures.

According to the electrical junction box in the third exemplary embodiment, it is possible to fasten the external terminals, connecting plate, and bus bar terminal portions under the condition where they are superimposed on one another directly. In result, it is possible to enhance an electrical current conductive efficiency from the external terminals to the bus bar.

In a fourth exemplary embodiment, the slits are provided in the peripheral wall at the one side and a proximal end of the partition wall in an inserting direction of the connecting plate. A latch recess is provided in the peripheral wall at the other side. The connecting plate is provided on an inserting end with a latch projection. The latch projection is engaged with the latch recess to constitute means for restraining displacement of the connecting plate.

According to the electrical junction box of the fourth exemplary embodiment, it is possible to prevent the connecting plate from moving in a direction perpendicular to the inserting direction of the connecting bolts, before the connecting bolts are attached to the bolt support section. Thus, it is possible to enhance accuracy in positioning between the bolt inserting apertures and the bolt receiving apertures. Consequently, it is easy to insert the connecting bolts insert into the bolt inserting apertures and bolt receiving apertures.

According to embodiments of the present invention, the connecting plate is previously inserted into the slits in the peripheral wall and proximal end of the partition wall and is previously disposed on the one surface of the bolt support section, a plurality of connecting bolts are attached to the bolt support section, and the connecting plate are mounted on the plural connecting bolts. Thus, although the partition wall is provided on the bolt support section to reinforce it, it is possible to avoid interference between the plural connecting bolts and the connecting plate.

DETAILED DESCRIPTION OF EMBODIMENTS

Figure 1:
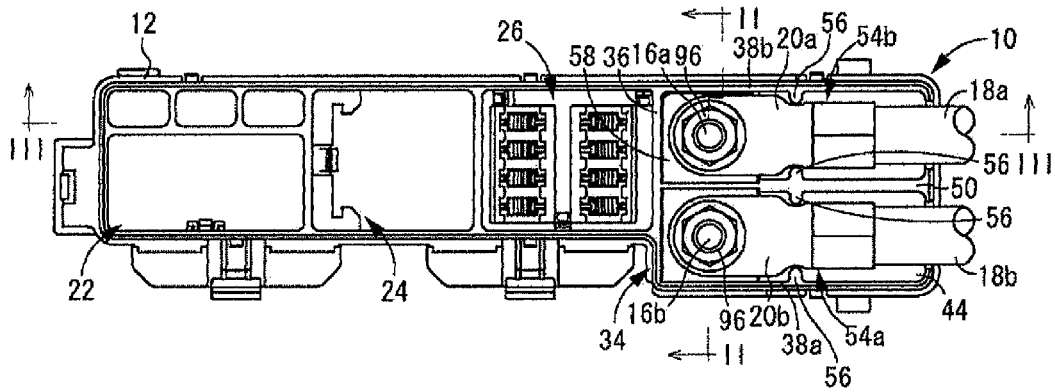
FIG. 1 is a plan view of a fuse box in an embodiment of an electrical junction box in accordance with the present invention.

Referring now to the drawings, embodiments of the present invention will be described below.

Figure 2:
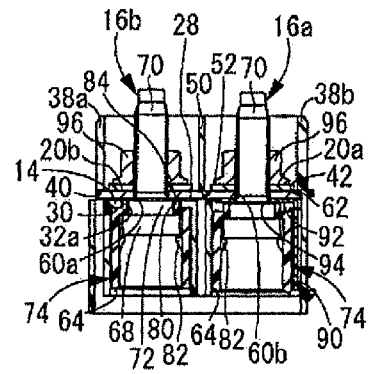
FIG. 2 is a cross section view taken along lines II-II in FIG. 1.
Figure 3:
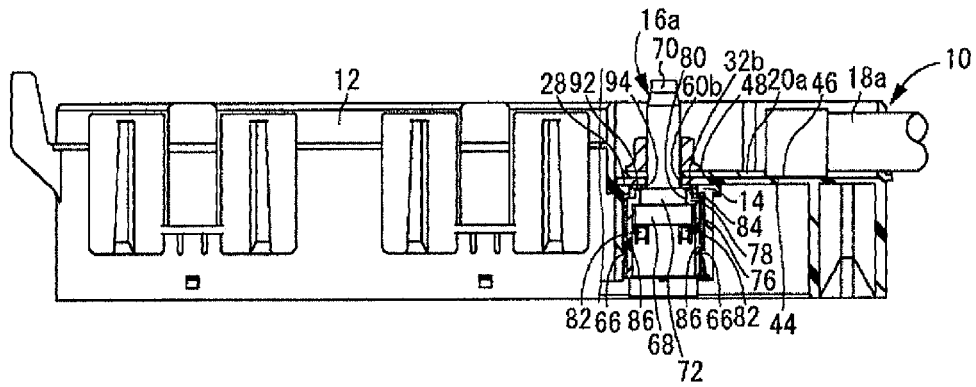
FIG. 3 is a partially broken longitudinal section view taken along lines III-III in FIG. 1.

FIGS. 1 to 3 show a fuse box 10 as an embodiment of an electrical junction box. The fuse box 10 includes a casing main body 12, an upper cover (not shown) attached to the fuse box 10 from an upper side, a lower cover (not shown) attached to the fuse box 10 from a lower side. The fuse box 10 is installed in a rear part of a vehicle body of a motor vehicle. Hereinafter, a vertical direction designates upper and lower directions in FIGS. 2 and 3 in principle.

Figure 4:
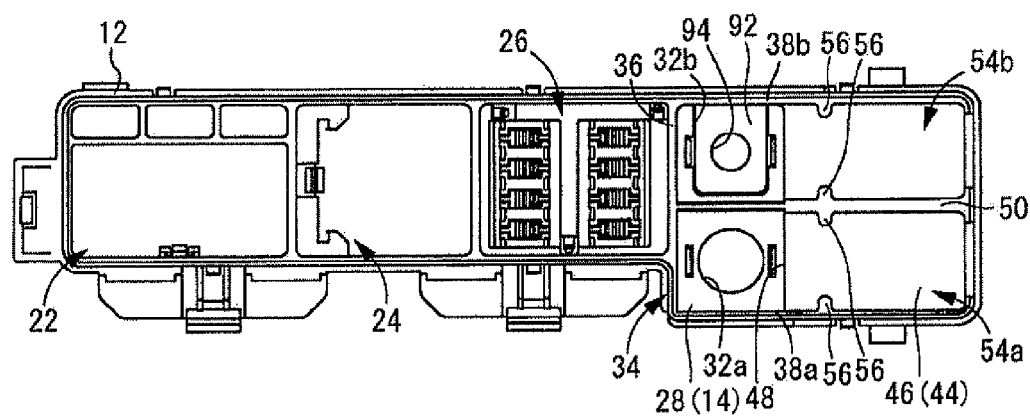
FIG. 4 is a plan view of a casing main body that constitutes the fuse box shown in FIG. 1, illustrating the casing main body on which a bus bar is mounted.
Figure 5:
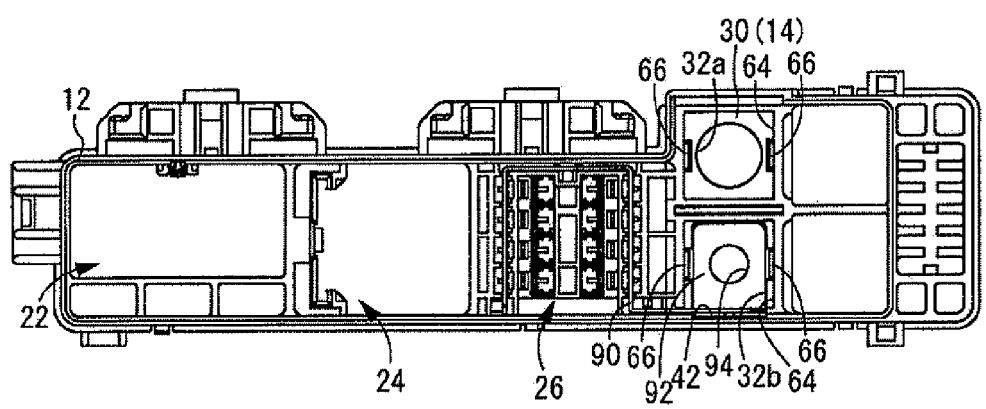
FIG. 5 is a bottom side view of the casing main body shown in FIG. 4.

Specifically, as shown also in FIGS. 4 and 5, the casing main body 12 is formed into a rectangular block-like configuration, as a whole. A size in a longitudinal direction (right and left directions in FIG. 4) is set to be sufficiently larger than a size in a lateral direction (upper and lower directions in FIG. 4). The casing main body 12 is provided with a bolt support section 14. Two connecting bolts 16a and 16b are attached to the bolt support section 14. An external terminal 20a of an electrical cable 18a from a battery disposed in a rear part of the vehicle body, while external terminal 20b of an electrical cable 18b to be connected to an electrical junction box disposed in a front part of the vehicle body. The casing main body 12 is further provided with relay mounting sections 22 and 24, and fuse mounting sections 26 that are open upward.

Relays and fuses (not shown) are mounted on the relay mounting sections 22 and 24, and the fuse mounting sections 26.

The bolt support section 14 is formed into a substantially rectangular plate-like configuration. An upper surface 28 that is the one surface in a thickness direction and a lower surface 30 that is the other surface in the thickness direction spread in a direction perpendicular to a height direction of the casing main body 12. Two bolt receiving apertures 32a and 32b penetrate the bolt support section 14 in its thickness direction and are arranged in the lateral direction of the casing main body 12. The one bolt receiving aperture 32a is a circular shape in cross section while the other bolt receiving aperture 32b is a substantially rectangular shape in cross section.

A peripheral wall 34 protrudes from the upper surface 28 of the bolt support section 14. The peripheral wall 34 includes a partition wall 36 that partitions the bolt support section 14 and the adjacent fuse mounting sections 26 extending in the lateral direction of the casing main body 12, and a pair of longitudinal walls 38a and 38b that extend in parallel with each other in the longitudinal direction (right and left directions in FIG. 5) of the casing main body 12. Thus, the peripheral wall 34 surrounds the two bolt receiving apertures 32a and 32b from three sides.

The one longitudinal wall 38a is provided on a proximal end with an inserting slit 40 that penetrates the wall 38a in its thickness direction. The other longitudinal wall 38b is provided on a proximal end with a latch recess 42 that is open in an inner side surface.

The longitudinal walls 38a and 38b extend to an upper surface 46 of an electrical cable support section 44 that extends toward the one end (a right side in FIG. 2) in the longitudinal direction of the casing main body 12. The upper surface 46 of the electrical cable support section 44 is disposed over the upper surface 28 of the bolt support section 14. Thus, a stepped portion 48 is formed between the bolt support section 14 and the electrical cable support section 44.

The bolt support section 14 is provided on the upper surface 28 with a partition wall 50. The partition wall 50 extends from an inner side surface of the partition wall 36 in parallel to the longitudinal walls 38a and 38b to partition the two bolt receiving apertures 32a and 32b. The partition wall 50 is provided on a proximal end portion with an inserting slit 52 that penetrates the wall 50 in its thickness direction.

The partition wall 50 extends to the upper surface 46 of the electrical cable support section 44, as is the case with the longitudinal walls 38a and 38b. Thus, electrical cable containing portions 54a and 54b that extend in the longitudinal direction of the casing main body 12 are provided in the electrical cable support section 44 between the one longitudinal wall 38a and the partition wall 50 and between the other longitudinal wall 38b and the partition wall 50.

Stopper projections 56 and 56 that protrude inward in the electrical cable containing portions 54a and 54b are provided on the pair of longitudinal walls 38a and 38b and the partition wall 50 and on portions that protrude to the upper surface 46 of the electrical cable support section 44. Thus, external terminals 20a and 20b are engaged with the stopper projections 56 in the longitudinal direction of the casing main body 12. Consequently, it is possible to prevent electrical cables 18a and 18b from being disengaged from the electrical cable containing portions 54a and 54b in the longitudinal direction of the casing main body 12.

A connecting plate 58 is mounted on the upper surface 28 of the bolt support section 14. The connecting plate 58 is made of a metallic material such as oxygen-free copper having a high electrical conductivity and is formed into a rectangular thick flat plate-like configuration, as a whole. Two bolt inserting apertures 60*a* and 60*b* are provided in the connecting plate 58 and arranged side by side in its longitudinal direction. A latch projection 62 is provided on an end of the connecting plate 58 in the longitudinal direction so as to protrude outward in the longitudinal direction.

The bolt containing section 14 is provided in the other surface in the thickness direction with bolt containing apertures 64. The bolt containing apertures 64 are disposed on the same central axes as those of the bolt receiving apertures 32*a* and 32*b*, have substantially rectangular shapes in cross section, and extend straightly in the height direction of the casing main body 12. Ends of the bolt containing apertures 64 are connected to the bolt receiving apertures 32*a* and 32*b*. Each bolt containing aperture 64 is provided on a pair of opposed side surfaces in the longitudinal direction of the casing main body 12 with an engaging projection 66, respectively.

The connecting bolts 16*a* and 16*b* to be attached to the bolt support section 14 include rectangular block-like head portions 68 and shaft portions 70 protruding from seats of the head portions 68. Each shaft portion 70 is provided on a proximal end with a proximal end side projection 72 that has a larger diameter than that of the shaft portion 70.

Bolt covers 74 and 74 made of synthetic resin are mounted on the connecting bolts 16*a* and 16*b*, respectively. Each bolt cover 74 includes a rectangular tubular wall 76 and a bottom wall 78 integrated with an end of the tubular wall 76 and is formed into a reversed rectangular box-like configuration provided with a recess that is open downward.

Such bolt covers 74 are mounted on the connecting bolts 16*a* and 16*b*. Under this condition, the head portions 68 are contained in the tubular walls 76 of the bolt covers 74 and the shaft portions 70 pass through inserting apertures 80 in the bottom walls 78 to protrude outward from the bolt covers 74.

If the head portion 68 turns about its central axis in the tubular wall 76, the head portion 68 will contact with the tubular wall 76. Thus, it is possible to restrain the head portion 68 from turning about its central axis in the tubular wall 76.

Each head portion 68 is contained in the tubular wall 76 with the head portion 68 passing over the latch projection piece 82 that is permitted to be elastically deformed in a direction where a projecting height of the piece 82 from an inner periphery of the tubular wall 76 becomes small and with the head portion 68 being disposed between the latch projection piece 82 and the bottom wall 78. Thus, it is possible to prevent the head portion 68 from being disengaged from the tubular wall 76.

When the head portion 68 is engaged with the latch projection piece 82, a clearance is defined between the head portion 68 and the bottom wall 78. Each of the connecting bolts 16*a* and 16*b* can move in an axial direction with respect to each bolt cover 74 by a distance corresponding to the clearance. When the head portion 68 contacts with the bottom wall 78, a distal end surface of the proximal end side projection 72 is disposed at a position higher than a projecting end surface of a collar 84 that protrudes from the bottom wall 78.

A bus bar 90 is incorporated in the casing main body 12 so that the bus bar 90 constitutes internal circuits for distributing an electrical power from a battery. The electrical power is supplied through a plurality of fuses installed in the fuse mounting sections 26 to electrical equipments for an audio device, a tow hitch, a back door, and the like that are installed in a rear part of the vehicle body. The bus bar 90 is formed by suitably bending a rectangular flat plate-like copper.

The bus bar 90 is provided with bus bar terminal portions 92. Each bus bar terminal portion 92 is formed into a rectangular flat plate-like configuration and is provided in a central part with a bolt inserting aperture 94.

Figure 6:
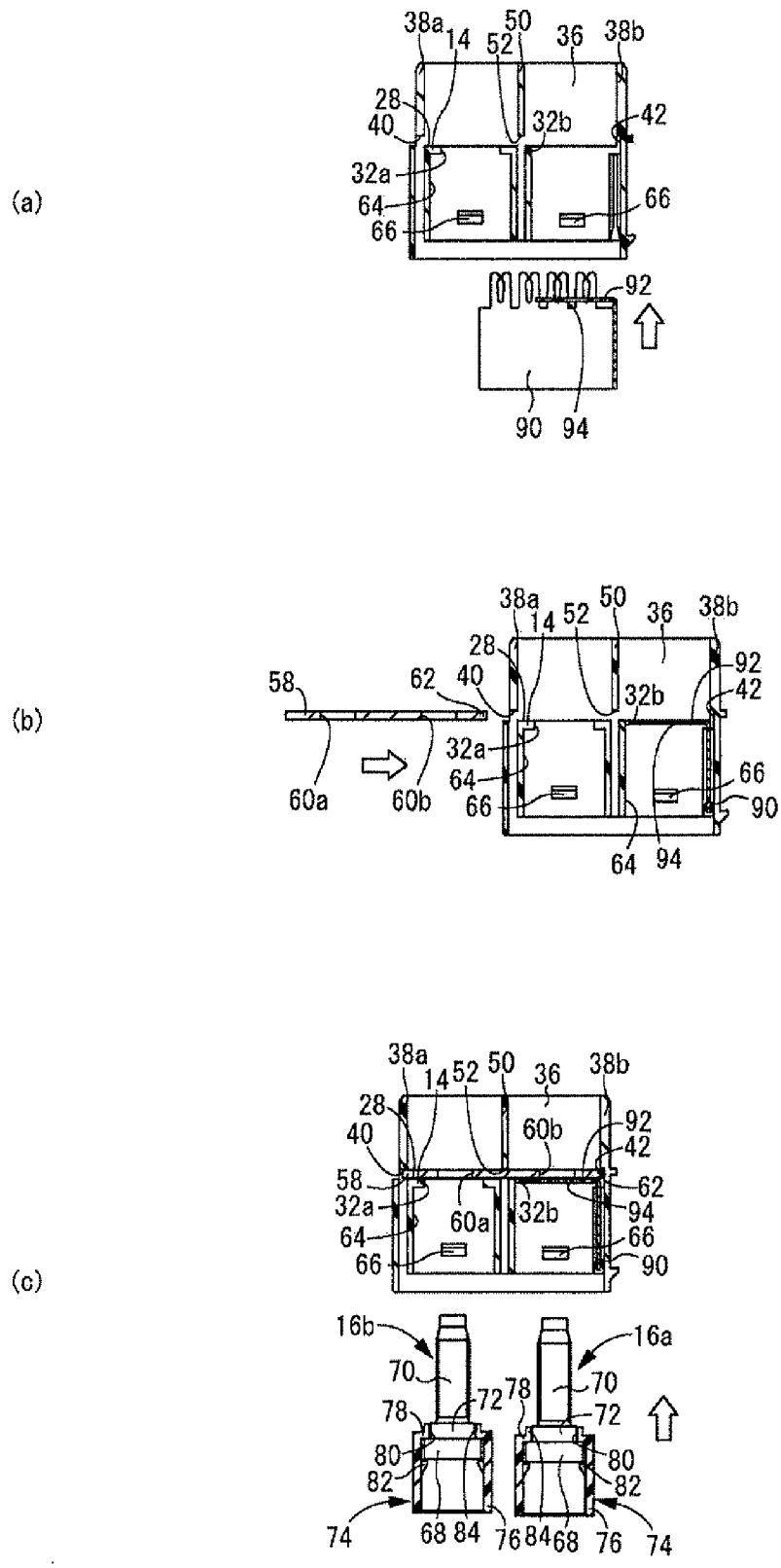
FIGS. 6A to 6C are explanatory views that illustrate assembling steps of the fuse box shown in FIG. 1.

As shown in FIG. 6A, the bus bar 90 is incorporated in the casing main body 12 from a lower side before the connecting bolts 16*a* and 16*b* are attached to the bolt support section 14. Under this condition, the bus bar terminal portions 92 are disposed in the bolt receiving apertures 32*b* and upper surfaces of the terminal portions 92 are disposed at the same level as the upper surface 28 of the bolt support section 14.

As shown in FIG. 6B, after the bus bar 90 is incorporated in the casing main body 12, the connecting plate 58 is inserted into the slits 40 and 52 at a longitudinal side end on which the latch projection 62 is provided and the connecting plate 58 is disposed on the upper surface 28 of the bolt support section 14. Under this condition, the connecting plate 58 is clamped between the partition wall 36 and the stepped portion 48 and the longitudinal end side of the plate 58 is superimposed on the bus bar terminal portions 92.

The latch projection 62 is inserted into and engaged with the latch recess 42. Thus, the connecting plate 58 is restrained from moving in the lateral direction. That is, the latch projection 62 and latch recess 42 constitute means for restraining displacement of the connecting plate 58.

The bolt inserting aperture 60*a* is disposed on the substantially same central axis as the bolt receiving aperture 32*a*, while the bolt receiving aperture 60*b* is disposed on the substantially same central axis as the bolt receiving aperture 32*b*.

As shown in FIG. 6C, when the connecting plate 58 is disposed on the upper surface 28 of the bolt support section 14, the connecting bolts 16*a* and 16*b* are inserted into the bolt containing apertures 64 and 64. Thus, the engaging projection 86 provided on the outer surface of each bolt cover 74 is engaged with the engaging projection 66 provided on the inner periphery of each bolt containing aperture 64 and the connecting bolts 16*a* and 16*b* are attached to the bolt support section 14 so that the bolt cover 74 is prevented from being disengaged from the bolt containing aperture 64. Thus, the connecting bolts 16*a* and 16*b* are attached to the bolt support section 14. Each bolt cover 74 is restrained from turning about the central axis in each bolt containing aperture 64 by contact of the bolt cover 74 with the inner periphery of the bolt containing aperture 64. Thus, the connecting bolts 16*a* and 16*b* are also restrained from turning about their central axes in the bolt containing apertures 64. That is, the bolt covers 74 and bolt containing apertures 64 constitute means for holding the bolts.

The tubular wall 76 is elastically deformed inward and the engaging projection 86 passes over the engaging projection 66, when the connecting bolts 16*a* and 16*b* are attached to the bolt support section 14. Then, the engaging projection 86 can be engaged with the engaging projection 66. The engaging projection 86 protrudes from a bottom surface of a recess provided in the outer periphery of the bolt cover 74.

When the engaging projection 86 is engaged with the engaging projection 66, a clearance is defined between the bolt cover 74 and the bolt support section 14. The bolt cover 74 can move in the axial direction with respect to the bolt containing aperture 64 by a distance corresponding to the clearance.

The collar portions 84 of the bolt covers 74 are inserted into the bolt receiving apertures 32*a* and 32*b* in the bolt support section 14. Thus, the shaft portions 70 of the connecting bolts 16*a* and 16*b* protrude from the upper surface 28 of the bolt support section 14. In result, the shaft portion 70 of the connecting bolt 16*a* is inserted into the bolt inserting aperture 94 in the bus bar terminal portion 92 and the bolt inserting aperture 60*b* in the connecting plate 58. The shaft portion 70 of the connecting bolt 16b is inserted into the bolt inserting aperture 60a in the connecting plate 58.

The external terminals 20a and 20b are incorporated on the connecting bolts 16a and 16b. Under this condition, a nut 96 is screwed on and fastened to each shaft portion 70. Thus, the external terminal 20a and 20b are secured to the connecting bolts 16a and 16b.

When the connecting bolts 16a and 16b are displaced toward the nuts 96 and 96 by a threading action between the nuts 96 and the shaft portions 70, the distal end surfaces of the proximal end side projections 72 protrude from the projecting end surfaces of the collar portions 84. If each nut 96 is further fastened from this condition, the bolt cover 74 also moves to the nut 96.

Thus, the external terminal 20a, connecting plate 58, bus bar terminal portion 92 are fastened directly among the nut 96, connecting bolt 16a, and proximal end side projection 72, and the external terminal 20a, connecting plate 58, and bus bar terminal portion 92 are electrically connected to and secured to one another. The external terminal 20b and connecting plate 58 are fastened directly between the nut 96 and the proximal end side projection 72 of the connecting bolt 16b, and the external terminal 20b and connecting plate 58 are electrically connected to and secured to each other strongly.

Consequently, the electrical power that is supplied from the battery through the electrical cable 18a to the fuse box 10 is supplied through the bus bar 90 to various kinds of external electrical equipments with an excellent current conductive efficiency.

Since the external terminal 20a and 20b are connected through the connecting plate 58 to each other, the electrical power supplied from the battery through the electrical cable 18a can be supplied through the electrical cable 18b to the electrical junction box installed in the front part of the vehicle body with the excellent current conductive efficiency.

The electrical cable 18a is disposed in the electrical cable containing portion 54b with the electrical cable 18a being attached to the connecting bolt 16a. The electrical cable 18b is disposed in the electrical cable containing portion 54a with the electrical cable 18b being attached to the connecting bolt 16b. Thus, the electrical cables 18a and 18b are attached to the connecting bolts 16a and 16b with the electrical cables 18a and 18b extending in a direction parallel to the longitudinal direction of the casing main body 12.

In the fuse box 10 described above, not only the peripheral wall 34 but also the partition wall 50 protrude from the bolt support section 14. Thus, it is possible to enhance a reinforcement effect for the bolt support section 14.

Before the shaft portions 70 and 70 of the connecting bolts 16a and 16b are inserted into the bolt inserting apertures 60b and 60a in the connecting plate 58, the connecting plate 58 is inserted into the inserting slits 40 and 52 and is disposed on the upper surface 28 of the bolt support section 14. Consequently, although the bolt support section 14 is provided with the partition wall 50, the partition wall 50 does not interfere with the two connecting bolts 16a and 16b when the connecting plate 58 are mounted on the connecting bolts 16a and 16b.

Each bolt cover 74 is kept to be contained in each bolt containing aperture 64. Thus, it is possible to maintain the connecting bolts 16a and 16b to be inserted in the bolt inserting apertures 60b and 60a.

The connecting plate 58 and bus bar terminals 92 are directly superimposed on each other. Thus, it is possible to enhance an electrical current conductive efficiency from the connecting plate 58 to the bus bar 90.

Particularly, since the connecting bolts 16a and 16b are displaced in the axial direction upon fastening of the nuts 96, even if any clearance is defined between the bus bar terminal portions 92 and the connecting plate 58 on account of low accuracy in assembling of the bus bar 90 in the casing main body 12, it is possible to directly superimpose the connecting plate 58 and bus bar terminal portions 92 on one another. Consequently, it is possible to enhance reliability in connection between the connecting plate 58 and the bus bar 90.

Since the latch projection 62 of the connecting plate 58 is engaged with the latch recess 42 in the peripheral wall 34, it is possible to prevent the connecting plate 58 from moving in the longitudinal direction of the casing main body 12, before the connecting bolts 16a and 16b are attached to the casing main body 12. Thus, it is possible to facilitate to insert the shaft portions 70 and 70 of the connecting bolts 16a and 16b into the bolt inserting apertures 60b and 60a in the connecting plate 58.

Since the connecting bolts 16a and 16b are not secured to the casing main body 12 previously by means of insert molding or press-fitting, it is possible to incorporate the bus bar 90 in the casing main body 12 from the lower side of the main body 12.

The connecting plate 58 is disposed on the upper surface 28 of the bolt support section 14 with the connecting plate 58 being inserted in the slit 52 in the proximal end of the partition wall 50. Thus, even if the connecting plate 58 floats up from the upper surface 28 of the bolt support section, when the casing main body 12 is turned upside down, the connecting plate 58 contacts with the partition wall 50, thereby preventing the connecting plate 58 from falling down from the casing main body 12. In result, it is possible to enhance flexibility in a work for attaching the connecting bolts 16a and 16b to the bolt support section 14.

Although the present invention is described in the embodiments in detail, it should be noted that the present invention is not limited to the above embodiments. For example, in the above embodiments, the head portions 68 and 68 of the connecting bolts 16a and 16b may be disposed directly on the engaging projections 66 provided on the inner periphery of the bolt containing apertures 64 and 64.

What is claimed is:

1. An electrical junction box comprising:
a bolt support section;
a plurality of connecting bolts attached to the bolt support section, the connecting bolts being fastened to and secured to the external terminals by nuts;
a plurality of bolt receiving apertures disposed side by side in the bolt support section, the bolt support section having
one surface and an other surface, the one surface having a peripheral wall formed integrally thereon that surrounds the bolt receiving apertures,
a partition wall provided inside the peripheral wall for partitioning the adjacent bolt receiving apertures,
inserting slits being provided at proximal ends of the peripheral wall and the partition wall, and
a connecting plate having first bolt inserting apertures disposed at positions corresponding to the bolt receiving apertures, the connecting plate being inserted into the inserting slits so that the connecting plate is disposed on the one surface of the bolt support section, the connecting bolts passing through the bolt receiving apertures and the first bolt inserting apertures from the other surface of the bolt support section for attachment to the bolt support section.

2. The electrical junction box according to claim 1, wherein the connecting bolts are inserted into the first bolt inserting apertures from the other surface of the bolt support section, the connecting bolts are restrained from turning about central axes and are prevented from being disengaged from the first bolt inserting apertures, the electrical junction box further comprising:

bolt holding means that maintain an attaching condition of the connecting bolts to the bolt support section.

3. The electrical junction box according to claim 2, further comprising:

a bus bar that defines internal circuits incorporated in the box; and bus bar terminal portions having second bolt inserting apertures, wherein the bus bar is integrally formed with one bus bar terminal portions having the second bolt inserting apertures, the bus bar terminal portions are inserted into the bolt receiving apertures from the other surface of the bolt support section to be superimposed on the connecting plate, and the connecting bolts are inserted into and fastened to the second bolt inserting apertures.

4. The electrical junction box according to claim 3, wherein the inserting slits are provided in the proximal ends of the peripheral wall at one side in an inserting direction of the connecting plate and the proximal end of the partition wall, the electrical junction box further comprising:

a latch recess is in the peripheral wall at an other side, the connecting plate having on an inserting end a latch projection, the latch projection being engaged with the latch recess to define means for restraining displacement of the connecting plate.

5. The electrical junction box according to claim 2, wherein the inserting slits are provided in the proximal ends of the peripheral wall at one side in an inserting direction of the connecting plate and the proximal end of the partition wall, the electrical junction box further comprising:

a latch recess is in the peripheral wall at an other side, the connecting plate having on an inserting end a latch projection, the latch projection being engaged with the latch recess to define means for restraining displacement of the connecting plate.

6. The electrical junction box according to claim 1, further comprising:

a bus bar that defines internal circuits incorporated in the box; and bus bar terminal portions having second bolt inserting apertures, wherein the bus bar is integrally formed with the bus bar terminal portions having the second bolt inserting apertures, the bus bar terminal portions are inserted into the bolt receiving apertures from the other surface of the bolt support section to be superimposed on the connecting plate, and the connecting bolts are inserted into and fastened to the second bolt inserting apertures.

7. The electrical junction box according to claim 6, wherein the inserting slits are provided in the proximal ends of the peripheral wall at one side in an inserting direction of the connecting plate and the proximal end of the partition wall, the electrical junction box further comprising:

a latch recess is in the peripheral wall at an other side, the connecting plate having on an inserting end a latch projection, the latch projection being engaged with the latch recess to define means for restraining displacement of the connecting plate.

8. The electrical junction box according to claim 1, wherein the inserting slits are provided in the proximal ends of the peripheral wall at one side in an inserting direction of the connecting plate and the proximal end of the partition wall, the electrical junction box further comprising:

a latch recess in the peripheral wall an other side, the connecting plate having on an inserting end a latch projection, the latch projection being engaged with the latch recess to define means for restraining displacement of the connecting plate.

* * * * *